(12) United States Patent
Aisu et al.

(10) Patent No.: US 6,278,322 B1
(45) Date of Patent: Aug. 21, 2001

(54) TRANSCONDUCTANCE AMPLIFIER AND AUTOMATIC GAIN CONTROL DEVICE USING IT

(75) Inventors: Katsuhiko Aisu, Hyogo; Junichi Ikeda, Osaka, both of (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/537,170

(22) Filed: Mar. 29, 2000

(30) Foreign Application Priority Data

Mar. 31, 1999 (JP) .................................................. 11-093652

(51) Int. Cl.[7] .................................. H03K 3/45; H03G 3/30
(52) U.S. Cl. ........................... 330/255; 330/257; 330/140
(58) Field of Search ............................ 330/51, 140, 254, 330/255, 257, 264, 288

(56) References Cited

U.S. PATENT DOCUMENTS

| 5,424,683 | * | 6/1995 | Takahashi | ............................ 330/255 |
|---|---|---|---|---|
| 5,565,815 | * | 10/1996 | Klein | ............................... 330/257 X |
| 5,668,501 | * | 9/1997 | Venes | .................................... 330/254 |
| 5,724,003 | * | 3/1998 | Jensen et al. | .................... 330/140 X |

FOREIGN PATENT DOCUMENTS

WO 96/07927   3/1996   (WO) .

\* cited by examiner

*Primary Examiner*—Steven J. Mottola
(74) *Attorney, Agent, or Firm*—Dickstein Shapiro Morin & Oshinsky LLP

(57) ABSTRACT

A first output stage outputs current to an output terminal via current-mirror circuits based on a voltage difference input to non-inverting and inverting terminals. A second output stage comprises current providing transistors connected with the current-mirror circuits of the first output stage in a current-mirror manner for providing current, and outputs the current to the output terminal via rectifying components and switches.

15 Claims, 9 Drawing Sheets

TRANSCONDUCTANCE AMPLIFIER AND AUTOMATIC GAIN CONTROL DEVICE USING IT

BACKGROUND OF THE INVENTION

1. Field of the Invention

The present invention generally relates to a transconductance amplifier, the transconductance of which can be changed when the polarity of a differential input voltage differs, and an automatic gain control device using it.

2. Description of the Related Art

The transconductance amplifier is such that different output currents can be obtained therefrom for a certain differential input voltage. FIG. 1 shows a circuit of such an amplifier (referred to as a 'transconductance amplifier circuit', hereinafter). The transconductance amplifier circuit will now be described briefly based on FIG. 1.

This transconductance amplifier circuit includes a plurality of p-channel MOS transistors Tr1, Tr2, Tr3, Tr7 and Tr8, and a plurality of n-channel MOS transistors Tr4, Tr5, Tr6 and Tr9, which are connected as shown in FIG. 1. Each pair of the transistors Tr4 and Tr6, transistors Tr7 and Tr8, and transistors Tr5 and Tr9 form a current-mirror circuit. The characteristics are the same between each pair of transistors which forms the current-mirror circuit.

In this transconductance amplifier circuit, a current I1 flows from a connection point 1 to a connection point 2, and, also, the same current I1 flows from the connection point 1 to a connection point 3. From an inverting input terminal 'a' connected to the gate of the transistor Tr1 and a non-inverting input terminal 'b' connected to the gate of the transistor Tr2, these transistors Tr1 and Tr2 constituting a differential stage, voltages are applied to the gates of these transistors Tr1 and Tr2, respectively. A current I2 flows from the connection point 2 to the source of the transistor Tr1, and, also, the same current I2 flows from the connection point 3 to the source of the transistor Tr2. Accordingly, a current (I1−I2) flows from the connection point 2 to a connection point 4, and, also, the same current (I1−I2) flows from the connection point 3 to a connection point 5. The voltage applied to the gate of the transistor Tr2 is higher than the voltage applied to the gate of the transistor Tr1 by Vin (referred to as a 'differential input voltage Vin', hereinafter). As a result, a current 'i' depending on the voltage difference between the gate and source of the transistor Tr3 flows from the connection point 5 to the connection point 4. Accordingly, a current (I1−I2+i) flows from the connection point 4 to the drain of the transistor Tr4, and a current (I1−I2−i) flows from the connection point 5 to the drain of the transistor Tr5.

Because the transistors Tr4 and Tr6 form the current-mirror circuit as mentioned above, the same current (I1−I2+i) as the current flowing from the connection point 4 to the drain of the transistor Tr4 flows from the drain of the transistor Tr7 to the drain of the transistor Tr6. Further, because the transistors Tr7 and Tr8 form the current-mirror circuit as mentioned above, the same current (I1−I2+i) as the current flowing from the drain of the transistor Tr7 to the drain of the transistor Tr6 flows from the drain of the transistor Tr8 to the connection point 6. Furthermore, because the transistors Tr5 and Tr9 form the current-mirror circuit as mentioned above, the same current (I1−I2−i) as the current flowing from the connection point 5 to the drain of the transistor Tr5 flows from the connection point 6 to the drain of the transistor Tr9. Thereby, a current 2i which is the difference between the current (I1−I2+i) flowing from the drain of the transistor Tr8 to the connection point 6 and the current (I1−I2−i) flowing from the connection point 6 to the drain of the transistor Tr9 is output from the connection point 6 in the direction indicated by the arrow. Hereinafter, the direction of the output current Iout is referred to as being positive when the current flows in the direction indicated by the arrow, and the direction of the output current Iout is referred to as being negative when the current flows in the direction reverse to the direction indicated by the arrow.

In this transconductance amplifier circuit, it is possible to change the transconductance of this circuit by changing the voltage difference between the gate and source of the transistor Tr3. In other words, as a result of the voltage difference between the gate and source of the transistor Tr3 being changed, the current 'i' flowing from the connection point 5 to the connection point 4 changes. Thus, it is possible to change the value of the current 2i output from the connection point 6, and, thus, to change the absolute value of the output current Iout, even when the value of the differential input voltage Vin does not change. Thus, it is possible to change the transconductance of this circuit.

In a transconductance amplifier circuit disclosed in International Patent Application, International Publication Number of which is WO 96/07927, a plurality of transistors are connected in parallel in an output stage, and, it is possible to change the absolute value of the output current and to change the transconductance of the circuit by selecting transistors which form current mirror circuits without changing the voltage difference between the gate and source of the transistor Tr3 shown in FIG. 1.

Such a transconductance amplifier circuit is used in such a form, as shown in FIG. 3, in which an integrator is added to the output of a transconductance amplifier (referred to as a 'Gm-C integrator', hereinafter), or is used in an automatic gain control device (a device provided with an automatic gain control circuit) which controls a gain of an apparatus using a Gm-C integrator. In such a use, there is a case where it is desired to change the absolute value of the output current when the polarity of the differential input voltage changes. This is because, in some apparatuses, the gain of which is controlled by an automatic gain control device, it is not always preferable to have a shorter setting time but it may be desired to change the setting time when the polarity of the differential input voltage changes, wherein the setting time originates in the value of the output current of the transconductance amplifier. In order to change the absolute value of the output current of the transconductance amplifier when the polarity of the differential input voltage changes, it is necessary to change the transconductance of the transconductance amplifier when the polarity of the differential input voltage changes.

However, in the above-described related art, although it is possible to change the transconductance, it is not possible to change the transconductance corresponding to the inclination of the line when the polarity of the differential input voltage changes, as shown In FIG. 2. Therefore, it is not possible to change the absolute value of the output current when the polarity of the differential input voltage changes. As a result, it is not possible to meet the requirement to change the setting time.

SUMMARY OF THE INVENTION

The present invention has been devised in order to solve such a problem, and an object of the present invention is to enable meeting the requirement to change the setting time by changing the absolute value of the output current, by providing a transconductance amplifier which can change the transconductance thereof, when the polarity of the differential input voltage Vin changes. Another object of the present invention is to provide an automatic gain control device using this transconductance amplifier.

A transconductance amplifier according to a first aspect of the present invention comprises:

a non-inverting input terminal;

an inverting input terminal;

an output terminal;

a first output stage which outputs current to the output terminal via current-mirror means based on a voltage difference input to the non-inverting and inverting terminals; and a second output stage which comprises current providing means connected with the current-mirror means of the first output stage in a current-mirror manner for providing current, and outputs the current to the output terminal via rectifying means and switch means.

The current-mirror means of the first output stage may comprise two current-mirror circuits, the current output to the output terminal from the first stage being provided by means of two transistors of the respective two current-mirror circuits;

the current providing means of the second output stage may comprise two transistors, each being connected to a respective one of the two transistors of the respective two current-mirror circuits so that a current-mirror circuit is formed, the current to be output to the output terminal from the second stage being provided by means of the two transistors of the current providing means;

the rectifying means of the second output stage may comprise two rectifying components, each allowing the current provided by a respective one of the two transistors of the current providing means to flow in one direction; and the switch means of the second output stage may comprise two switch components, each either enabling or disabling the current provided by a respective one of the two transistors of the current providing means to be output to the output terminal.

In this arrangement, by appropriately controlling the switch components of the switch means, it is possible to cause the current output to the output terminal from the second output stage to be different when the polarity of the voltage difference input to the transconductance amplifier is different by means of the switch components and rectifying components of the rectifying means.

The reason therefor will now be described. The two transistors of the current providing means of the second output stage are connected to the two transistors of the respective current-mirror circuits of the current-mirror means of the first output stage so that the respective current-mirror circuits are formed. Thereby, when the polarity of the voltage difference input to the transconductance amplifier is positive, that is, the voltage applied to the non-inverting input terminal is higher than the voltage applied to the inverting input terminal, the current is output to the output terminal from the first output stage by means of the two transistors of the respective current-mirror circuits, and, similarly, the current is provided by the two transistors of the current providing means of the second output stage. When the polarity of the voltage difference input to the transconductance amplifier is negative, that is, the voltage applied to the inverting input terminal is higher than the voltage applied to the non-inverting input terminal, the current flows into the first output stage from the output terminal by means of the two transistors of the respective current-mirror circuits, and, similarly, the current is drawn by the two transistors of the current providing means of the second output stage.

Then, it is assumed that the rectifying means and switch means of the second output stage are arranged so that, when a first switch component of the switch means is turned on, the current provided by the current providing means flows through a corresponding first rectifying component of the rectifying means to the output terminal, and, when the second switch component of the switch means is turned on, the current drawn by the current providing means flows through the corresponding second rectifying component of the rectifying means from the output terminal.

Further, the output current from the transconductance amplifier is the sum of the current provided by the first output stage and the current provided by the second output stage.

Therefore, it is possible to change the absolute value of the output current of the transconductance amplifier when the polarity of the voltage difference input to the transconductance amplifier changes, by appropriately controlling turning on/off of the switch components. As a result, it is possible to meet the requirement to change setting time when the polarity of the voltage difference input to the transconductance amplifier changes.

A transconductance amplifier according to a second aspect of the present invention comprises:

a non-inverting input terminal;

an inverting input terminal;

an output terminal;

a first output stage which outputs current to the output terminal via current-mirror means based on a voltage difference input to the non-inverting and inverting terminals; and a second output stage which comprises a plurality of output stages, each comprising current providing means connected with the current-mirror means of the first output stage in a current-mirror manner for providing current, and outputting the current to the output terminal via rectifying means and switch means.

The current-mirror means of the first output stage may comprise two current-mirror circuits, the current output to the output terminal from the first stage being provided by means of two transistors of the respective two current-mirror circuits;

the current providing means of each of the plurality of output stages of the second output stage may comprise two transistors, each being connected to a respective one of the two transistors of the respective two current-mirror circuits so that a current-mirror circuit is formed, the current to be output to the output terminal from each of the plurality of output stages of the second stage being provided by means of the two transistors of the current providing means;

the rectifying means of each of the plurality of output stages of the second output stage may comprise two rectifying components, each allowing the current provided by a respective one of the two transistors of the current providing means to flow in one direction; and the switch means of each of the plurality of output stages of the second output stage may comprise two switch components, each either enabling or disabling the current provided by a respective one of the two transistors of the current providing means to be output to the output terminal.

In this arrangement, by the reason the same as the above-described reason for the first aspect of the present invention, it is possible to change the absolute value of the output current of the transconductance amplifier when the polarity of the voltage difference input to the transconductance amplifier changes, by appropriately controlling turning on/off of the switch components. As a result, it is possible to meet the requirement to change setting time when the polarity of the voltage difference input to the transconductance amplifier changes. Further, in this arrangement, because the second output stage comprises a plurality of output stages, it is possible to obtain the output current of various absolute values of the transconductance amplifier, that is, to obtain the transconductance of various values of the transconductance amplifier by controlling turning on/off of the switch components of the plurality of output stages. As a result, it is possible to meet the requirement to obtain the various setting times.

In the transconductance amplifier according to the first aspect of the present invention, the current providing means of the second output stage may comprise a plurality of current providing means, and enabling means for either enabling or disabling, individually, the plurality of current providing means to provide current to the output terminal.

Further, the current-mirror means of the first output stage may comprise two current-mirror circuits, the current output to the output terminal from the first stage being provided by means of two transistors of the respective two current-mirror circuits;

each of the plurality of current providing means may comprise a pair of transistors, each of the pair or transistors being connected to a respective one of the two transistors of the respective two current-mirror circuits of the first output stage so that a current-mirror circuit is formed;

the enabling means may comprise a pair of switch components for the pair of transistors of each of the plurality of current providing means;

the rectifying means of the second output stage may comprise two rectifying components, each allowing the current provided by the plurality of current providing means to flow in one direction; and the switch means of the second output stage may comprise two switch components, each either enabling or disabling the current provided by the plurality of current providing means to be output to the output terminal.

In this arrangement, by the reason the same as the above-described reason for the first aspect of the present invention, it is possible to change the absolute value of the output current of the transconductance amplifier when the polarity of the voltage difference input to the transconductance amplifier changes, by appropriately controlling turning on/off of the switch components. As a result, it is possible to meet the requirement to change setting times when the polarity of the voltage difference input to the transconductance amplifier changes. Further, in this arrangement, because the current providing means comprises the plurality of current providing means and enabling means is provided for either enabling or disabling individually the plurality of current providing means to provide the current, it is possible to obtain the output current of various absolute values of the transconductance amplifier, that is, to obtain the transconductance of various values of the transconductance amplifier by controlling turning on/off of the switch components of the plurality of output stages. As a result, it is possible to meet the requirement to obtain the various setting times.

An automatic gain control device according to the present invention comprises:

a transconductance amplifier for providing an output current from an output terminal thereof based on a voltage difference input to a non-inverting input terminal and an inverting input terminal thereof;

means for providing the voltage difference based on an amplitude of an output signal of an apparatus, a gain of which is controlled by said device, to said transconductance amplifier; and means for providing a gain control signal based on the output current of said transconductance amplifier to said apparatus, the gain of said apparatus being controlled by the gain control signal, wherein the transconductance amplifier is any one of those described above.

In this arrangement, as a result of the absolute value of the output current of the transconductance amplifier being different when the polarity of the voltage difference input to the transconductance amplifier is different, it is possible to control the setting times of the apparatus, the gain of which is controlled by the device, that is, the attack time and decay time, individually.

Other objects and further features of the present invention will become more apparent from the following detailed description when read in conjunction with the accompanying drawings.

DETAILED DESCRIPTION OF THE PREFERRED EMBODIMENTS

Figure 4:
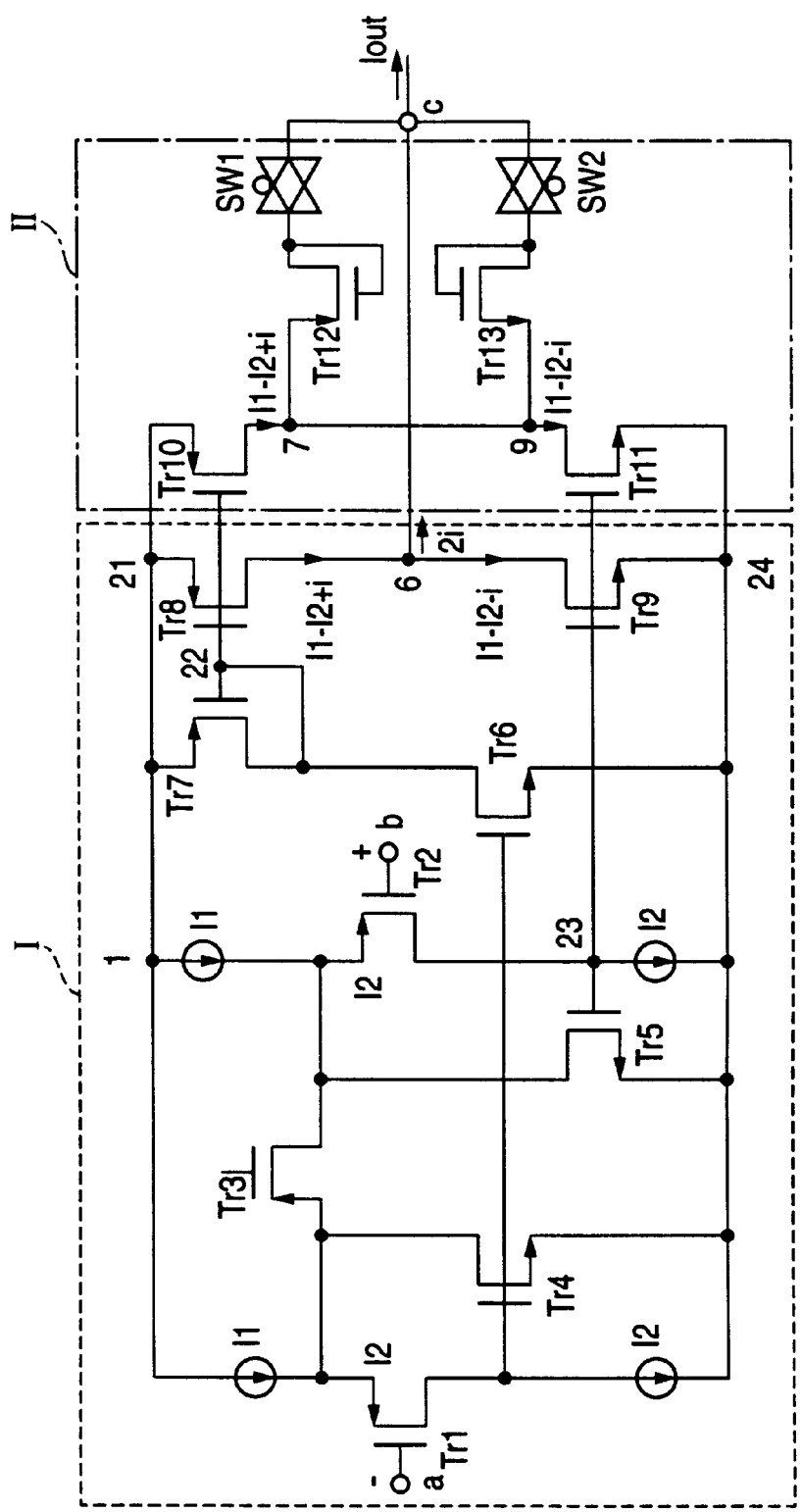
FIG. 4 shows a circuit diagram of a transconductance amplifier in a first embodiment of the present invention.
Figure 5:
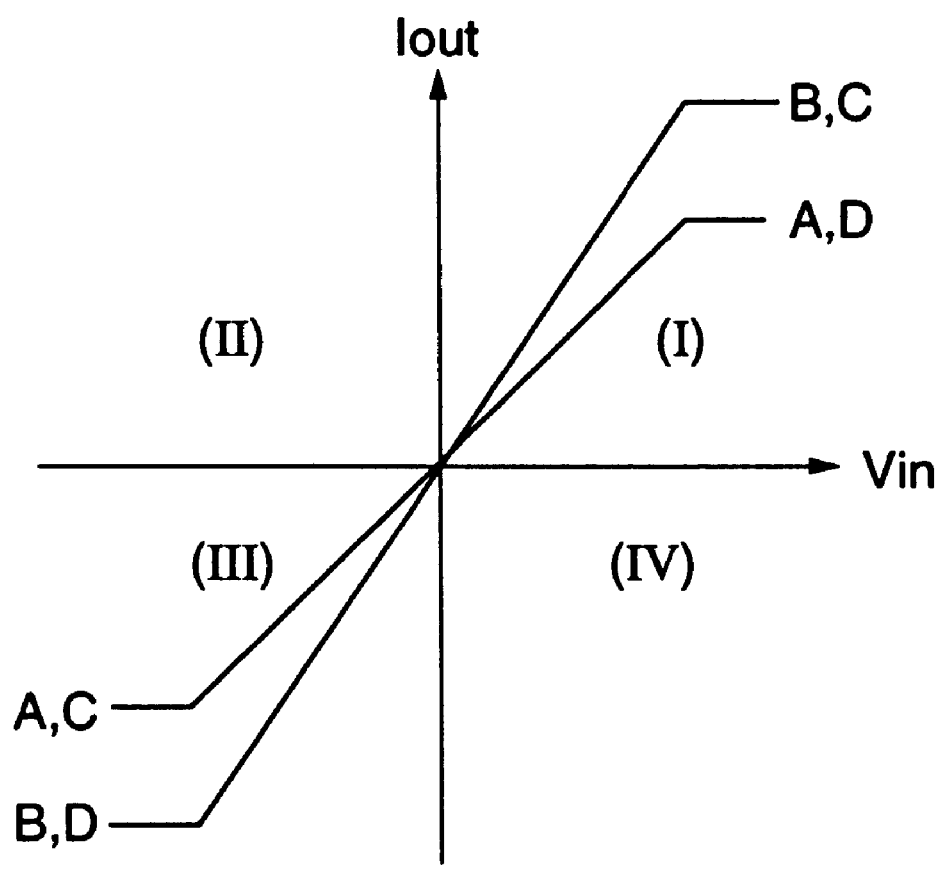
FIG. 5 shows the output current versus the differential input voltage in the transconductance amplifier shown in FIG. 4.

A first embodiment of the present invention will now be described based on FIGS. 4 and 5. In FIG. 4, the circuit arrangement 'I' surrounded by the broken line is the same as that shown in FIG. 1, and, in this circuit arrangement, the same reference numerals are given to the same portions, the description thereof will be omitted, and the circuit arrangement 'II' surrounded by the chain line will now be described. The circuit obtained as a result of the inverting input terminal 'a' connected to the gate of the transistor Tr1 and the non-inverting input terminal 'b' connected to the transistor Tr2 being excepted from the circuit 'I' is a first output stage, and the circuit 'II' is a second output stage.

Transistors Tr10 and Tr12 are p-channel MOS transistors, and Tr11 and Tr13 are n-channel MOS transistors. The transistor Tr10 acting as a transistor for control forms a current-mirror circuit together with the transistor Tr7 and a current-mirror circuit together with the transistor Tr8. The characteristics of the transistor Tr10 are the same as the characteristics of the transistor Tr7, and, also, as the characteristics of the transistor Tr8. Further, the transistor Tr11 acting as a transistor for control forms a current-mirror circuit together with the transistor Tr5 and a current-mirror circuit together with the transistor Tr9. The characteristics of the transistor Tr11 are the same as the characteristics of the transistor Tr5, and, also, as the characteristics of the transistor Tr9. The transistor for control is such that it is possible that the transconductance is variable as a result of the current flowing through the transistor being controlled by a switch.

The transistors Tr12 and Tr13 are devices for performing rectifying functions. Specifically, the gate and drain of the transistor Tr12 are short-circuited, and, when the output current Iout flows in the positive direction, the voltages at the gate and drain are lower than the voltage at the source, and a current can flow through the transistor Tr12. However, when the output current Iout flows in the negative direction, the voltages at the gate and drain are higher than the voltage at the source, and no current flows through the transistor Tr12. A switch SW1 is connected to the point at which the gate and drain of the transistor Tr12 are short-circuited. Then, when the switch SW1 is turned on, the current can flow through the circuit. However, when the switch SW1 is turned off, no current flows through the circuit. Thereby, when the switch SW1 is turned on and also the output current Iout flows in the positive direction, a current flows from a connection point 7 to an output terminal c. However, in the other cases, no current flows from the connection point 7 to the output terminal c. Further, the current 2i flows from the connection point 6 to the output terminal c by means of the transistors Tr8 and Tr9, when the output current Iout flows in the positive direction, regardless of whether or not the switch SW1 is turned on. When the current flows from the connection point 7 to the output terminal c, this current and the current flowing from the connection point 6 to the output terminal c are added together at the output terminal c and are output.

The gate and drain of the transistor Tr13 are short-circuited, and, when the output current Iout flows in the positive direction, the voltages at the gate and drain are lower than the voltage at the source, and no current flows through the transistor Tr13. However, when the output current Iout flows in the negative direction, the voltage at the gate and drain are higher than the voltage at the source, and a current can flow through the transistor Tr13. A switch SW2 is connected to the point at which the gate and drain of the transistor Tr13 are short-circuited. Then, when the switch SW2 is turned on, the current can flow through the circuit. However, when the switch SW2 is turned off, no current flows through the circuit. Thereby, when the switch SW2 is turned on and also the output current flows in the negative direction, the current flows from the output terminal c to a connection point 9. However, in the other cases, no current flows from the output terminal c to the connection point 9. Further, the current 2i flows from the output terminal c to the connection point 6 by means of the transistors Tr8 and Tr9, when the output current Iout flows in the negative direction, regardless of whether or not the switch SW2 is turned on. When the current flows from the output terminal c to the connection point 9, the current flowing into the transconductance amplifier circuit from the output terminal c flows to the connection point 6 and to the connection point 9.

The transconductance amplifier circuit has the above-described arrangement. Therefore, it is possible to obtain the output current Iout shown in FIG. 5 depending on respective conditions described below.

A case will now be described where both the switches SW1 and SW2 are turned off. In this case, no current flows through the transistors Tr12 and no current flows through the transistors Tr13, and no current flows from the connection point 7 to the output terminal c and no current flows from the output terminal c to the connection point 9 by means of the transistors Tr10 and Tr11. Accordingly, when the output current Iout flows in the positive direction, the current 2i flowing from the connection point 6 to the output terminal c is output from the output terminal c. When the output current Iout flows in the negative direction, the current 2i flowing from the output terminal c to the connection point 6 flows into the transconductance amplifier circuit from the output terminal c. The line A shown in FIG. 5 shows this relationship between the output current Iout and the differential input voltage Vin. As shown in the figure, the inclination of the line A does not change, and the transconductance is fixed, even when the polarity of the differential input voltage Vin changes.

A case will now be described where both the switches SW1 and SW2 are turned on. When the output current Iout flows in the positive direction, the current flows through the transistor Tr12 and the current 2i flows from the connection point 7 to the output terminal c. At this time, no current flow through the transistor Tr13. Accordingly, the current 4i obtained from adding together the current 2i flowing from the connection point 6 to the output terminal c and the current 2i flowing from the connection point 7 to the output terminal c is output from the output terminal c. The reason why the current flowing from the connection point 6 to the output terminal c is the same as the current 2i flowing from the connection point 7 to the output terminal c is that, as mentioned above, the characteristics of the transistor Tr10 are the same as the characteristics of the transistor Tr7 and as the characteristics of the transistor Tr8, and, also, the characteristics of the transistor Tr11 are the same as the characteristics of the transistor Tr9 and as the characteristics of the transistor Tr5. When the output current Iout flows in the negative direction, the current flows through the transistor Tr13 and the current 2i flows from the output terminal c to the connection point 9. At this time, no current flows through the transistor Tr12. Accordingly, the current 4i obtained from adding together the current 2i flowing from the output terminal c to the connection point 6 to and the current 2i flowing from the output terminal c to the connection point 9 flows into the transconductance amplifier circuit from the output terminal c. The line B shown in FIG. 5 shows this relationship between the output current Iout and the differential input voltage Vin. As shown in the figure, although the double output current Iout is obtained for the same differential input voltage Vin in comparison to the line A, the inclination of the line B does not change, and the transconductance is fixed, even when the polarity of the differential input voltage Vin changes.

A case will now be described where the switch SW1 is turned on and the switch SW2 is turned off. At this time, because the switch SW1 is turned on, when the output current Iout flows in the positive direction, the current flows through the transistor Tr12, and the current 2i flows from the connection point 7 to the output terminal c. However, when the output current Iout flows in the negative direction, no current flows through the transistor Tr12, and no current flows from the connection point 7 to the output terminal c.

At this time, because the switch SW2 is turned off, no current flows through the transistor Tr13, and no current flows from the output terminal c to the connection point 9, even when the output current Iout flows in the negative direction. Accordingly, when the output current Iout flows in the positive direction, the current 4i obtained from adding together the current 2i flowing from the connection point 6 to the output terminal c and the current 2i flowing from the connection point 7 to the output terminal c is output from the output terminal c. When the output current Iout flows in the negative direction, only the current 2i flowing from the output terminal c to the connection point 6 flows into the transconductance amplifier circuit from the output terminal c. The line C shown in FIG. 5 shows this relationship between the output current Iout and the differential input voltage Vin. That is, when the output current Iout flows in the positive direction, because the output current Iout is 4i, the line C in the first quadrant (I) of FIG. 5 is the same as the line B in the first quadrant (I) of FIG. 5 obtained when both the switches SW1 and SW2 are turned on. When the output current Iout flows in the negative direction, because the output current Iout is −2i, the line C in the third quadrant (III) of FIG. 5 is the same as the line A in the third quadrant (III) of FIG. 5 obtained when both the switches SW1 and SW2 are turned off. As it is clear from FIG. 5, when the switch SW1 is turned on and the switch SW2 is turned off, the change in the polarity of the differential input voltage Vin results in the change in the transconductance of the transconductance amplifier circuit.

A case will now be described where the switch SW1 is turned off and the switch SW2 is turned on. At this time, because the switch SW2 is turned on, when the output current Iout flows in the negative direction, the current flows through the transistor Tr13, and the current 2i flows from the output terminal c to the connection point 9. However, when the output current Iout flows in the positive direction, no current flows through the transistor Tr13, and no current flows from the output terminal c to the connection point 9. At this time, because the switch SW1 is turned off, no current flows through the transistor Tr12, and no current flows from the connection point 7 to the output terminal c, even when the output current Iout flows in the positive direction. Accordingly, when the output current Iout flows in the negative direction, the current 4i obtained from adding together the current 2i flowing from the output terminal c to the connection point 6 and the current 2i flowing from the output terminal c to the connection point 9 flows into the transconductance amplifier circuit from the output terminal c. When the output current Iout flows in the positive direction, only the current 2i flowing from the connection point 6 to the output terminal c is output from the output terminal c. The line D shown in FIG. 5 shows this relationship between the output current Iout and the differential input voltage Vin. That is, when the output current Iout flows in the negative direction, because the output current Iout is −4i, the line D in the third quadrant (III) of FIG. 5 is the same as the line B in the third quadrant (III) of FIG. 5 obtained when both the switches SW1 and SW2 are turned on. When the output current Iout flows in the positive direction, because the output current Iout is 2i, the line D in the first quadrant (I) of FIG. 5 is the same as the line A in the first quadrant (I) of FIG. 5 obtained when both the switches SW1 and SW2 are turned off. As it is clear from FIG. 5, when the switch SW1 is turned off and the switch SW2 is turned on, the change in the polarity of the differential input voltage Vin results in the change in the transconductance of the transconductance amplifier circuit.

From the transconductance amplifier having the transconductance amplifier circuit in the first embodiment, the following advantages are obtained. When the switch SW1 is turned on and the switch SW2 is turned off, the transconductance of the transconductance amplifier circuit when the output current Iout flows in the positive direction is twice the transconductance thereof when the output current Iout flows in the negative direction. When the switch SW1 is turned off and the switch SW2 is turned on, the transconductance of the transconductance amplifier circuit when the output current Iout flows in the negative direction is twice the transconductance thereof when the output current Iout flows in the positive direction. Thus, in either case, when the polarity of the differential input voltage Vin is different, the different transconductance can be obtained. Thereby, it is possible to change the absolute value of the output current Iout by changing the transconductance when the polarity of the differential input voltage Vin changes. As a result, it is possible to meet the requirement to change the setting times.

When this transconductance amplifier is used in an automatic gain control device, the different absolute value of the current can be obtained when the polarity of he differential input voltage changes in the automatic gain control device, and, it is possible to change the setting times of an apparatus, the gain of which is controlled by the automatic gain control device. Specifically, the above-mentioned setting times include a decay time which means a time period required for, when the amplitude of an output voltage of the apparatus decreases, causing the amplitude to return to an original one by compensating for the decrease, and an attack time which means a time period required for, when the amplitude of the output voltage of the apparatus increases, causing the amplitude to return to the original one by reducing the increase. When it is desired to lengthen the decay time, the switch SW1 is turned off, and, thereby, as indicated by the line A, D in the first quadrant (I) of FIG. 5, the output current Iout is reduced. When it is desired to shorten the decay time, the switch SW1 is turned on, and, thereby, as indicated by the line B, C in the first quadrant (I) of FIG. 5, the large output current Iout is output. When it is desired to lengthen the attack time, the switch SW2 is turned off, and, thereby, as indicated by the line A, C in the third quadrant (III) of FIG. 5, the current flowing into the transconductance amplifier is reduced. When it is desired to shorten the attack time, the switch SW2 is turned on, and, thereby, as indicated by the line B, D in the third quadrant (III) of FIG. 5, the current flowing into the transconductance amplifier is enlarged. Thus, by controlling the switch SW1 and switch SW2 depending on the desired decay time and attack time, it is possible to change the setting times depending on the particular apparatus.

When using this automatic gain control device, it possible to change the setting times depending on the particular apparatus by turning both the switch SW1 and switch SW2 on or turning both the switch SW1 and switch SW2 off, and, then, changing the output current by changing the voltage difference between the gate and source of the transistor Tr3.

Figure 9:
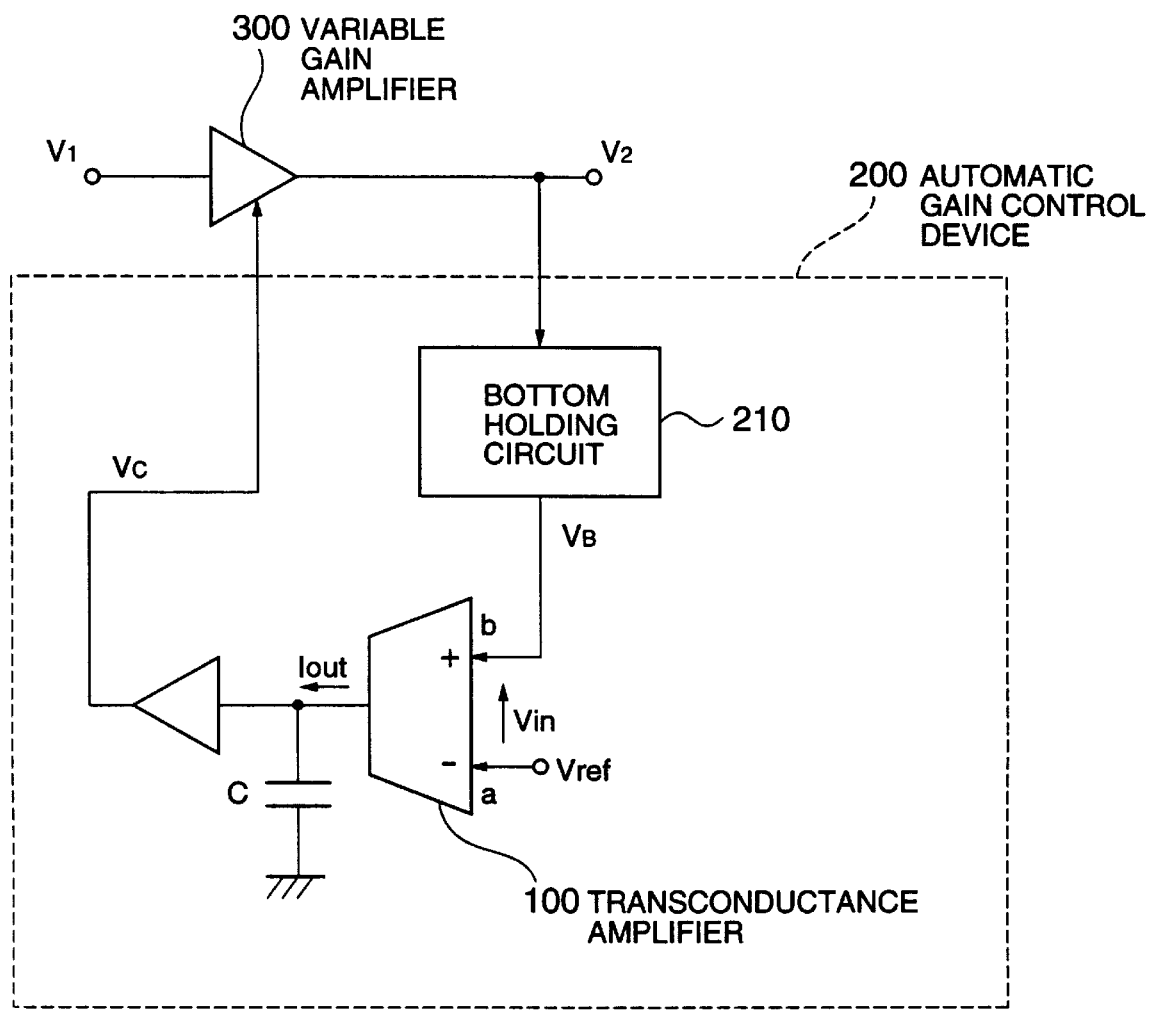
FIG. 9 shows a circuit diagram illustrating a case where an automatic gain control device in one embodiment of the present invention is used for controlling the gain of a variable gain amplifier.
Figure 10A:
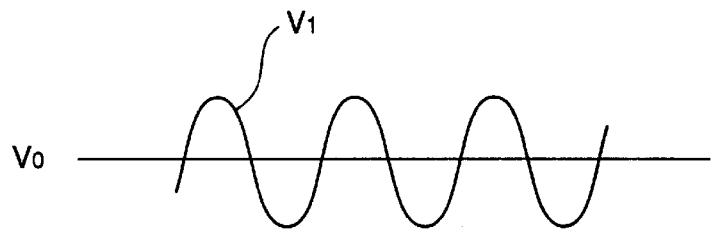
FIGS. 10A, 10B and 10C show waveforms of signals in the automatic gain control device shown in FIG. 9.
Figure 10B:
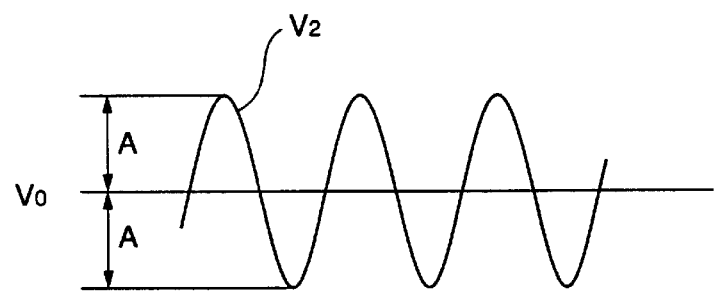
Figure 10C:
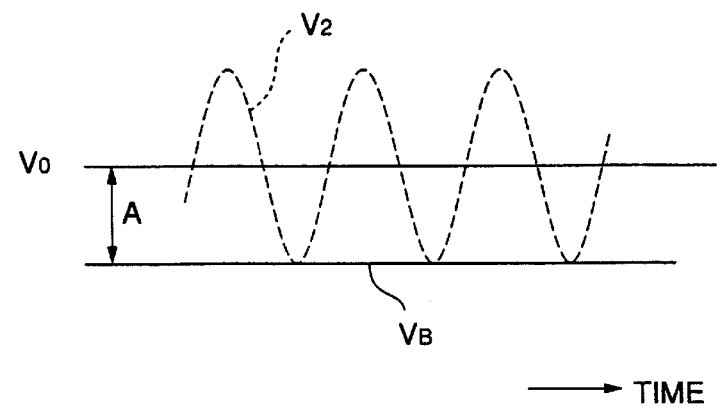

FIG. 9 shows one example of such an automatic gain control device 200 using the transconductance amplifier 100 having the transconductance amplifier circuit in any embodiment of the present invention described above and below. In this example, an apparatus, the gain of which is controlled by the automatic gain control device, is a variable gain amplifier 300. FIGS. 10A, 10B and 10C show the waveforms of voltages in the automatic gain control device 200.

The automatic gain control device 200 includes a bottom holding circuit 210 which holds the bottom level of the output voltage $V_2$, shown in FIG. 10B, of the variable gain amplifier 300, and outputs the direct-current voltage $V_B$ of the thus-held level, shown in FIG. 10C. This direct-current voltage $V_B$ is input to the non-inverting input terminal 'b' of the transconductance amplifier 100 according to the present invention. A predetermined reference voltage Vref is input to the inverting input terminal 'a' of this transconductance amplifier 100. The voltage $V_0$ shown in FIGS. 10A, 10B and 10C is a predetermined fixed voltage.

In the automatic gain control device 200 shown in FIG. 9, when the amplitude A of the output voltage $V_2$ of the variable gain amplifier 300 with respect to the voltage $V_0$ increases, the bottom level of the voltage $V_2$ decreases, and, as a result, the voltage $V_B$ output from the bottom holding circuit 210 decreases. Then, when the voltage $V_B$ becomes lower than the reference voltage Vref, the polarity of the differential input voltage Vin of the transconductance amplifier 100 becomes negative. As a result, the output current Iout of the transconductance amplifier 100 comes to flow in the negative direction. That is, the current flows into the transconductance amplifier 100 from the output terminal thereof. Thereby, a capacitance component C connected to the output terminal of the transconductance amplifier 100 is discharged. As a result, a gain control voltage Vc provided to the variable gain amplifier 300 decreases, thereby the gain of the variable gain amplifier 300 decreases, and, as a result, the amplitude A of the output voltage $V_2$ of the variable gain amplifier 300 with respect to the voltage $V_0$ decreases.

When the amplitude A of the output voltage $V_2$ of the variable gain amplifier 300 with respect to the voltage $V_0$ decreases, the bottom level of the voltage $V_2$ increases, and, as a result, the voltage $V_B$ output from the bottom holding circuit 210 increases. Then, when the voltage $V_B$ becomes higher than the reference voltage Vref, the polarity of the differential input voltage Vin of the transconductance amplifier 100 becomes positive. As a result, the output current Iout of the transconductance amplifier comes to flow in the positive direction. That is, the current flows out from the transconductance amplifier 100 at the output terminal thereof. Thereby, the capacitance component C connected to the output terminal of the transconductance amplifier 100 is charged. As a result, the gain control voltage Vc provided to the variable gain amplifier 300 increases, thereby the gain of the variable gain amplifier 300 increases, and, as a result, the amplitude A of the output voltage $V_2$ of the variable gain amplifier 300 with respect to the voltage $V_0$ increases.

Thus, negative feedback is performed, and the gain of the variable gain amplifier 300 is controlled so that the voltage $V_B$ output from the bottom holding circuit 210 becomes equal to the reference voltage Vref, and, thus, the amplitude A of the output voltage $V_2$ of the variable gain amplifier 300 comes to have a fixed value.

Figure 6A:
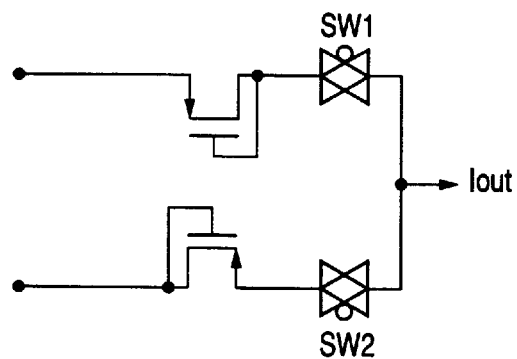
FIGS. 6A, 6B and 6C show examples of rectifying components usable in any of embodiments of the present invention.
Figure 6B:
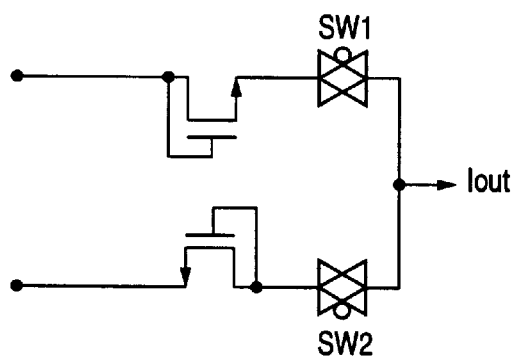
Figure 6C:
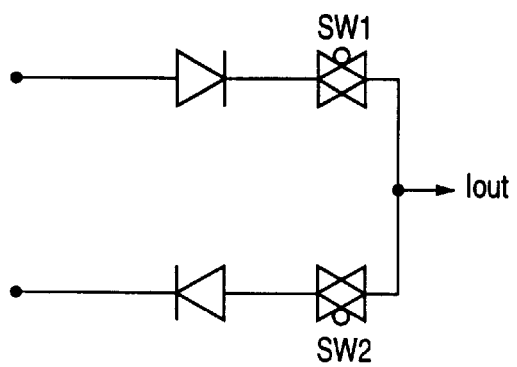

The rectifying components of the first embodiment are not limited to the p-channel MOS transistor Tr12 and n-channel MOS transistor Tr13, and, instead, any other arrangement can be used as long as the arrangement allows a current to flow therethrough in one direction. Specifically, as shown in FIG. 6A, p-channel MOS transistors can be used as the rectifying components. Alternatively, as shown in FIG. 6B, n-channel MOS transistors can be used as the rectifying components. Alternatively, as shown in FIG. 6C, pn-junction diodes can be used as the rectifying components.

Figure 1:
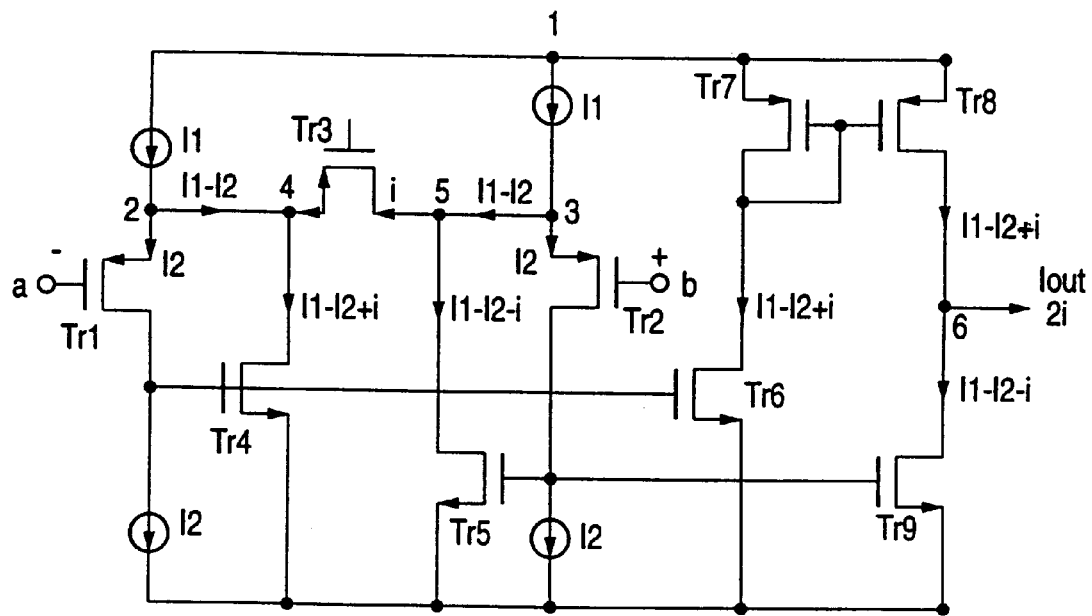
FIG. 1 shows a circuit diagram of a transconductance amplifier in the related art.
Figure 2:
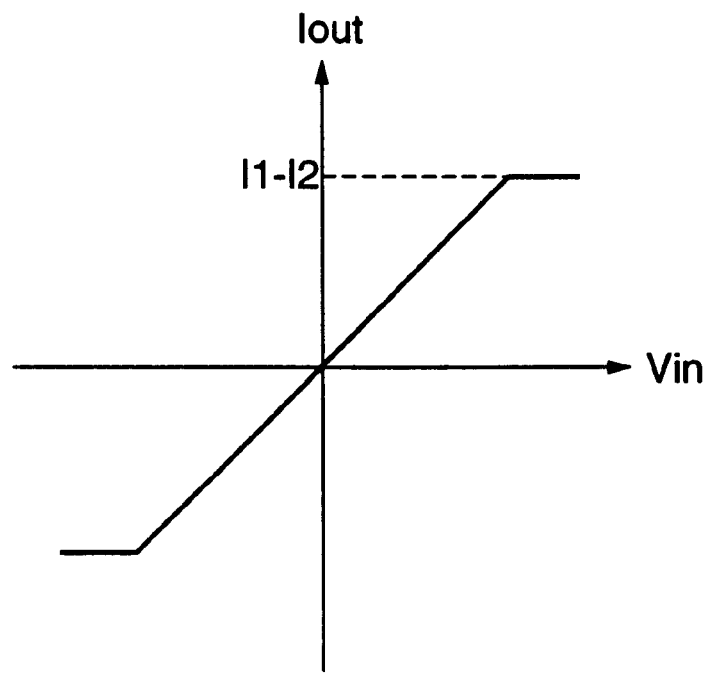
FIG. 2 shows an output current versus a differential input voltage in the transconductance amplifier shown in FIG. 1.
Figure 3:
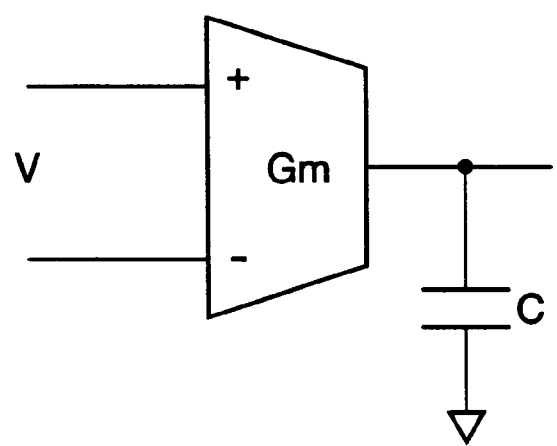
FIG. 3 shows a Gm-C integrator.
Figure 7:
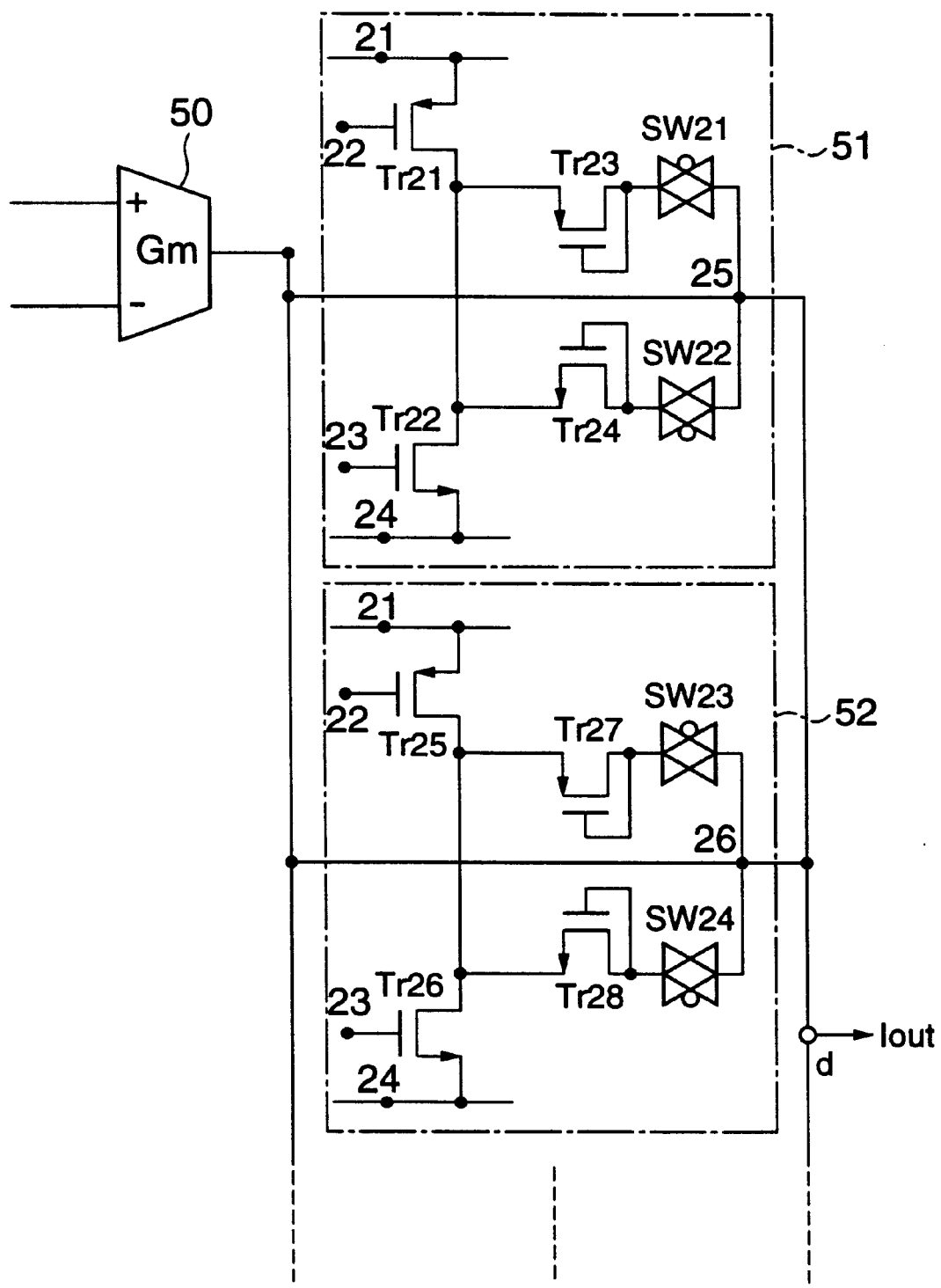
FIG. 7 shows a circuit diagram of a transconductance amplifier in a second embodiment of the present invention.

A second embodiment of the present invention will now be described based on FIGS. 7, 4 and 1. In FIG. 7, a Gm 50 simply represents the transconductance amplifier circuit shown in FIG. 1. Mainly, points at which the second embodiment is different from the above-described first embodiment will be described.

In the transconductance amplifier circuit in the second embodiment, circuits 51, 52, . . . , each having the same circuit arrangement as that of the second output stage 'II' of the first embodiment shown in FIG. 4, are connected to the Gm 50 in parallel. For the sake of simplifying the description, only the circuits 51 and 52 will now be described. A transistor Tr21 of the circuit 51 and a transistor Tr25 of the circuit 52 form current-mirror circuits together with the transistors Tr7 and Tr8 of the Gm 50, and the transistor Tr21 of the circuit 51 and the transistor Tr25 of the circuit 52 are different from one another in the characteristics thereof. A transistor Tr22 of the circuit 51 and a transistor Tr26 of the circuit 52 form current-mirror circuits together with the transistors Tr5 and Tr9 of the Gm 50, and the transistor Tr22 of the circuit 51 and the transistor Tr26 of the circuit 52 are different from one another in the characteristics thereof. The transistors Tr21, Tr22, Tr25 and Tr26 act as the transistors for control.

The circuit connection will now be described briefly. The gate of each of the transistors Tr21 and Tr25 is connected to a connection point 22 between the gates of the transistors Tr7 and Tr8. The source of each of the transistors Tr21 and Tr25 is connected to a connection point 21 between the sources of the transistors Tr7 and Tr8. The gate of each of the transistors Tr22 and Tr26 is connected to a connection point 23 between the gates of the transistors Tr5 and Tr9. The source of each of the transistors Tr22 and Tr26 is connected to a connection point 24 between the sources of the transistors Tr5 and Tr9.

Further, a connection point 25 at which a current is output from the circuit 51 is connected to the connection point 6 at which a current is output from the Gm 50. From the connection point 25, the current obtained as a result of the current obtained from the circuit 51 and the current obtained from the Gm 50 being added together is output. A connection point 26 at which a current is output from the circuit 52 is also connected to the connection point 6 at which the current is output from the Gm 50. From the connection point 26, the current obtained as a result of the current obtained from the circuit 52 and the current obtained from the Gm 50 being added together is output. Then, from an output terminal d, the current obtained as a result of the current obtained from the connection point 25 and the current obtained from the connection point 26 being added together is output.

In the transconductance amplifier having the transconductance amplifier circuit in the second embodiment, similarly to the case of using the transconductance amplifier circuit in the first embodiment, when the polarity of the differential input voltage Vin is different, the different transconductance can be obtained. Thereby, it is possible to change the absolute value of the output current Iout by changing the transconductance when the polarity of the differential input voltage Vin changes. As a result, it is possible to meet the requirement to change the setting times.

Further, because the transistor Tr21 of the circuit 51 and the transistor Tr25 of the circuit 52 are different from one another in the characteristics thereof, the value of the current output from the circuit 51 is different from the value of the current output from the circuit 52. Accordingly, by appropriately controlling the turning on/off of the switches SW21, SW22, SW23 and SW24 provided in the respective circuits 51 and 52, it is possible to obtain the transconductance of various values. Further, by increasing the number of circuits, such as the circuits 51 and 52, to be connected in parallel to the Gm 50, it is possible to obtain the transconductance of more various values. Accordingly, it is possible to meet the requirement to obtain the various setting times when the polarity of the different input voltage Vin changes.

Further, when the transconductance amplifier having this transconductance amplifier circuit is used in an automatic gain control device, the automatic gain control device can change the attack time and decay time of an apparatus, the gain of which is controlled by this device, separately.

The present invention in this aspect is not limited to the above-described second embodiment, and, it is possible to embody the present invention in this aspect after altering as follows:

In the second embodiment, the transistor Tr21 of the circuit 51 and the transistor Tr25 of the circuit 52 are different from one another in the characteristics thereof, and, also, the transistor Tr22 of the circuit 51 and the transistor Tr26 of the circuit 52 are different from one another in the characteristics thereof. However, it is not necessary that the transistor Tr21 of the circuit 51 and the transistor Tr25 of the circuit 52 be different from one another in the characteristics thereof, and, also, it is not necessary that the transistor Tr22 of the circuit 51 and the transistor Tr26 of the circuit 52 be different from one another in the characteristics thereof. It is also possible that the transistor Tr21 of the circuit 51 and the transistor Tr25 of the circuit 52 are the same as one another in the characteristics thereof, and, also, it is possible that the transistor Tr22 of the circuit 51 and the transistor Tr26 of the circuit 52 are the same as one another in the characteristics thereof. In this arrangement, as long as the number of the circuits connected to the Gm 50 in parallel is the same as the number of the circuits connected to the Gm 50 in parallel in the second embodiment, although the number of values of the transconductance obtained from the arrangement is smaller than that obtained from the second embodiment, it is possible to meet the requirement to change the setting times by changing the transconductance when the polarity of the different input voltage Vin changes.

Also in the second embodiment, similarly to the case of the first embodiment, the p-channel MOS transistors may be used as the rectifying components of each circuit of the circuits 51, 52, . . . , as shown in FIG. 6A, the n-channel MOS transistors may be used as the rectifying components of each circuit of the circuits 51, 52, . . . , as shown in FIG. 6B, and the pn-junction diodes may be used as the rectifying components of each circuit of the circuits 51, 52, . . . , as shown in FIG. 6C.

A third embodiment of the present invention will now be described based on FIGS. 8, 4 and 1. Mainly, points in which the third embodiment is different from the above-described first embodiment will be described.

Figure 8:
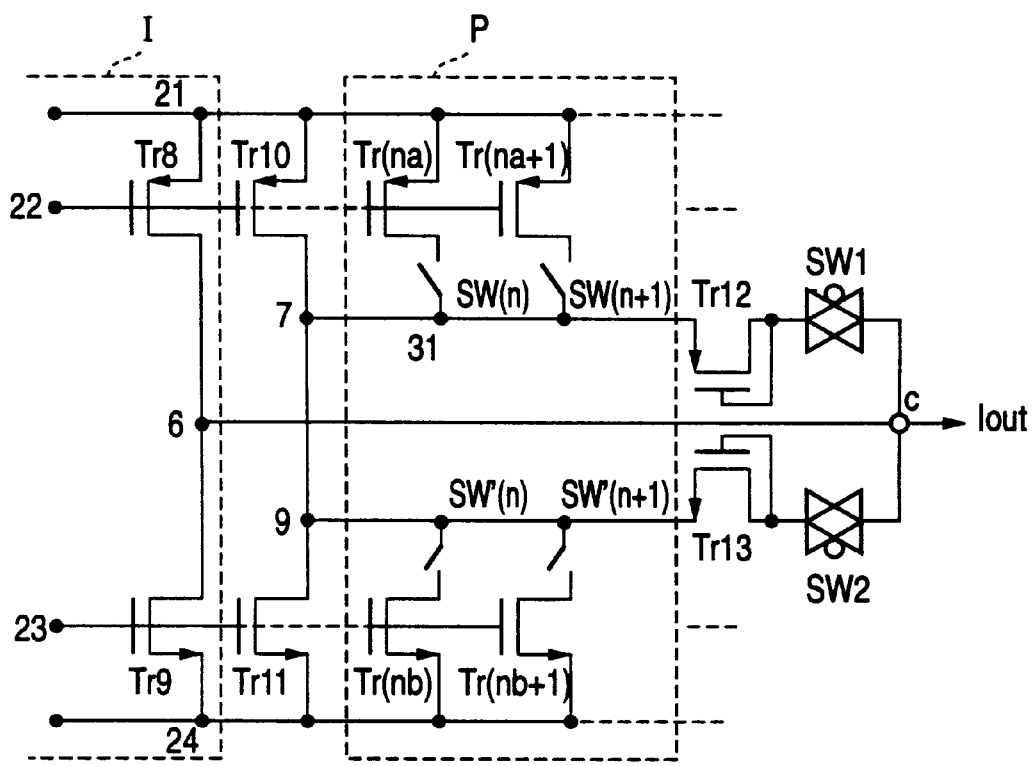
FIG. 8 shows a circuit diagram of a transconductance amplifier in a third embodiment of the present invention.

The third embodiment is different from the first embodiment in that groups of transistors in the portion P shown in FIG. 8 are connected in parallel to the first output stage 'I'. Details will now be described.

The gate of each of a plurality of p-channel MOS transistors Tr (na), Tr (na+1), . . . , acting as the transistor for control, is connected to the connection point 22 between the gates of the transistors Tr7, Tr8 and Tr10. These transistors Tr (na), Tr (na+1), . . . , and the transistor Tr10 are different from each other in the characteristics thereof. Further, the source of each of the transistors Tr (na), Tr (na+1), . . . , is connected to the connection point 21 between the sources of the transistors Tr7, Tr8 and Tr10. The drain of each of the transistors Tr (na), Tr (na+1), . . . , is connected to the connection point 7 when the corresponding one of switches SW (n), SW (n+1), . . . , acting as first switch means, is closed, and, thereby, it is possible for the corresponding transistor to flow a current therethrough.

The gate of each of a plurality of n-channel MOS transistors Tr (nb), Tr (nb+1), . . . , acting as the transistor for control, is connected to the connection point 23 between the gates of the transistors Tr5, Tr9 and Tr11. These transistors Tr (nb), Tr (nb+1), . . . , and the transistor Tr11 are different from each other in the characteristics thereof. Further, the source of each of the transistors Tr (nb), Tr (nb+1), . . . , is connected to the connection point 24 between the sources of the transistors Tr5, Tr9 and Tr11. The drain of each of the transistors Tr (nb), Tr (nb+1), . . . , is connected to the connection point 9 when the corresponding one of switches SW'(n), SW'(n+1), . . . , acting as the first switch means, is closed, and, thereby, it is possible for the corresponding transistor to flow a current therethrough.

The pair of the switches SW (n) and SW'(n) are closed at the same time, or are opened at the same time; the pair of the switches SW (n+1) and SW'(n+1) are closed at the same time, or are opened at the same time; . . .

Accordingly, assuming that the SW1 acting as second switch means is turned on, the SW2 acting as the second switch means is turned off, the pair of the switches SW (n) and SW'(n) acting as the first switch means are closed but the pair of the switches SW (n+1) and SW'(n+1) acting as the first switch means are opened, a current flows through the transistor Tr (na), and the transistor Tr (na) forms current mirror circuits together with the transistors Tr7, Tr8 and Tr10. Similarly, a current flows through the transistor Tr (nb), and the transistor Tr (nb) forms current mirror circuits together with the transistors Tr5, Tr9 and Tr11.

Then, when the output current Iout flows in the positive direction, the current, obtained as a result of the current flowing from the connection point 6 to the output terminal c, the current flowing from the connection point 7 to the output terminal c by means of the transistors Tr10 and Tr11, and the current flowing from the connection point 31 to the output terminal c by means of the transistors Tr (na) and Tr (nb) being added together, is output from the output terminal c. When the output current Iout flows in the negative direction, because the switch SW2 is turned off, the current flowing into the transconductance amplifier circuit in the third embodiment from the output terminal c is only the current flowing from the output terminal c to the connection point 6.

In the transconductance amplifier having the transconductance amplifier circuit in the third embodiment of the present invention, similar to the transconductance amplifier circuit in the first embodiment of the present invention, the different transconductance can be obtained when the polarity of the differential input voltage Vin is different. Thereby, it is possible to change the absolute value of the output current Iout by changing the transconductance when the polarity of the differential input voltage Vin changes. Therefore, it is possible to meet the requirement to change the setting time.

Further, the transistors Tr (na), Tr (na+1), . . . , and the transistor Tr10 have the different characteristics, respectively. Furthermore, Tr (nb), Tr (nb+1), . . . , and the transistor Tr11 have the different characteristics, respectively. Thereby, by appropriately controlling close/open of the pairs of switches SW (n), SW'(n); SW (n+1), SW'(n+1); . . . , it is possible to obtain the transconductance of various values. Further, by increasing the number of pairs of transistors Tr (na), Tr (nb); Tr (na+1), Tr (nb+1); . . . , it is possible to obtain the transconductance of more various values. Therefore, it is possible to meet the requirement to obtain the various setting times when the polarity of the differential input voltage Vin changes.

Further, when the transconductance amplifier having this transconductance amplifier circuit is used in an automatic gain control device, the automatic gain control device can change the attack time and decay time of an apparatus, the gain of which is controlled by this device, separately.

The present invention in this aspect is not limited to the above-described third embodiment, and, it is possible to embody the present invention in this aspect after altering as follows:

In the third embodiment, the transistors Tr (na), Tr (na+1), ..., and the transistor Tr10 have the different characteristics, respectively, and, Tr (nb), Tr (nb+1), ..., and the transistor Tr11 have the different characteristics, respectively. However, it is not necessary that the transistors Tr (na), Tr (na+1), ..., and the transistor Tr10 have the different characteristics, respectively, and, Tr (nb), Tr (nb+1), ..., and the transistor Tr11 have the different characteristics, respectively. It is also possible that the respective characteristics of the transistors Tr (na), Tr (na+1), ..., and the transistor Tr10 are the same as each other, and the respective characteristics of the transistors Tr (nb), Tr (nb+1), ..., and the transistor Tr11 are the same as each other. In this arrangement, as long as the number of the transistors Tr (na), Tr (na+1), ..., and the transistors Tr (nb), Tr (nb+1), ... is the same as that of the third embodiment, although the number of values of the transconductance obtained from the arrangement is smaller than that obtained from the third embodiment, it is possible to meet the requirement to change the setting times by changing the transconductance when the polarity of the different input voltage Vin changes.

Further, in the third embodiment, it is also possible to enable selection as to whether or not the current is obtained by means of the transistors Tr10 and Tr11 by controlling close/open of switches provided at the connection points 7 and 9.

Also in the third embodiment, similarly to the case of the first embodiment, the p-channel MOS transistors may be used as the rectifying components as shown in FIG. 6A, the n-channel MOS.transistors may be used as the rectifying components as shown in FIG. 6B, or the pn-junction diodes may be used as the rectifying components as shown in FIG. 6C.

Further, the present invention is not limited to the above-described embodiments and variations and modifications may be made without departing from the scope of the present invention.

The present application is based on Japanese priority application No. 11-093652, filed on Mar. 31, 1999, the entire contents of which are hereby incorporated by reference.

What is claimed is:

1. A transconductance amplifier comprising:
a non-inverting input terminal;
an inverting input terminal;
an output terminal;
a first output stage which outputs current to said output terminal via current-mirror means based on a voltage difference input to said non-inverting and inverting terminals; and
a second output stage which comprises current providing means connected with said current-mirror means of said first output stage in a current-mirror manner for providing current, and outputs the current to said output terminal via rectifying means and switch means.

2. The transconductance amplifier as claimed in claim 1, wherein:
said current-mirror means of said first output stage comprises two current-mirror circuits, the current output to said output terminal from said first stage being provided by means of respective two transistors of said two current-mirror circuits;
said current providing means of said second output stage comprises two transistors, each being connected to a respective one of said two transistors of said two current-mirror circuits so that a current-mirror circuit is formed, the current to be output to said output terminal from said second stage being provided by means of said two transistors of said current providing means;
said rectifying means of said second output stage comprises two rectifying components, each allowing the current provided by a respective one of said two transistors of said current providing means to flow in one direction; and
said switch means of said second output stage comprises two switch components, each either enabling or disabling the current provided by a respective one of said two transistors of said current providing means to be output to said output terminal.

3. A transconductance amplifier comprising:
a non-inverting input terminal;
an inverting input terminal;
an output terminal;
a first output stage which outputs current to said output terminal via current-mirror means based on a voltage difference input to said non-inverting and inverting terminals; and
a second output stage which comprises a plurality of output stages, each comprising current providing means connected with said current-mirror means of said first output stage in a current-mirror manner for providing current, and outputting the current to said output terminal via rectifying means and switch means.

4. The transconductance amplifier as claimed in claim 3, wherein:
said current-mirror means of said first output stage comprises two current-mirror circuits, the current output to said output terminal from said first stage being provided by means of respective two transistors of said two current-mirror circuits;
said current providing means of each of said plurality of output stages of said second output stage comprises two transistors, each being connected to a respective one of said two transistors of said two current-mirror circuits so that a current-mirror circuit is formed, the current to be output to said output terminal from each of said plurality of output stages of said second output stage being provided by means of said two transistors;
said rectifying means of each of said plurality of output stages of said second output stage comprises two rectifying components, each allowing the current provided by a respective one of said two transistors of said current providing means to flow in one direction; and
said switch means of each of said plurality of output stages of said second output stage comprises two switch components, each either enabling or disabling the current provided by a respective one of said two transistors of said current providing means to be output to said output terminal.

5. The transconductance amplifier as claimed in claim 1, wherein said current providing means of said second output stage comprises a plurality of current providing means, and enabling means for either enabling or disabling, individually, said plurality of current providing means to provide current to said output terminal.

6. The transconductance amplifier as claimed in claim 5, wherein:

said current-mirror means of said first output stage comprises two current-mirror circuits, the current output to said output terminal from said first stage being provided by means of respective two transistors of said two current-mirror circuits;

each of said plurality of current providing means comprises a pair of transistors, each of said pair of transistors being connected to a respective one of said two transistors of said two current-mirror circuits of said first output stage so that a current-mirror circuit is formed;

said enabling means comprises a pair of switch components for said pair of transistors of each of said plurality of current providing means;

said rectifying means of said second output stage comprises two rectifying components, each allowing the current provided by said plurality of current providing means to flow in one direction; and said switch means of said second output stage comprises two switch components, each either enabling or disabling the current provided by said plurality of current providing means to be output to said output terminal.

7. An automatic gain control device comprising:

a transconductance amplifier for providing an output current from an output terminal thereof based on a voltage difference input to a non-inverting input terminal and an inverting input terminal thereof;

means for providing the voltage difference based on an amplitude of an output signal of an apparatus, a gain of which is controlled by said device, to said transconductance amplifier; and means for providing a gain control signal based on the output current of said transconductance amplifier to said apparatus, the gain of said apparatus being controlled by the gain control signal, wherein said transconductance amplifier comprises:

a first output stage which outputs current to said output terminal via current-mirror means based on the voltage difference input to said non-inverting and inverting terminals; and a second output stage which comprises current providing means connected with said current-mirror means of said first output stage in a current-mirror manner for providing current, and outputs the current to said output terminal via rectifying means and switch means.

8. An automatic gain control device comprising:

a transconductance amplifier for providing an output current from an output terminal thereof based on a voltage difference input to a non-inverting input terminal and an inverting input terminal thereof;

means for providing the voltage difference based on an amplitude of an output signal of an apparatus, a gain of which is controlled by said device, to said transconductance amplifier; and means for providing a gain control signal based on the output current of said transconductance amplifier to said apparatus, the gain of said apparatus being controlled by the gain control signal, wherein said transconductance amplifier comprises:

a first output stage which outputs current to said output terminal via current-mirror means based on the voltage difference input to said non-inverting and inverting terminals; and a second output stage which comprises a plurality of output stages, each comprising current providing means connected with said current-mirror means of said first output stage in a current-mirror manner for providing current, and outputting the current to said output terminal via rectifying means and switch means.

9. The automatic gain control device as claimed in claim 7, wherein said current providing means of said second output stage comprises a plurality of current providing means, and enabling means for either enabling or disabling, individually, said plurality of current providing means to provide current to said output terminal.

10. A transconductance amplifier comprising:

a non-inverting input terminal;

an inverting input terminal;

an output terminal;

a first output stage which outputs current to said output terminal via a current-mirror portion based on a voltage difference input to said non-inverting and inverting terminals; and a second output stage which comprises a current providing portion connected with said current-mirror portion of said first output stage in a current-mirror manner for providing current, and outputs the current to said output terminal via a rectifying portion and a switch portion.

11. A transconductance amplifier comprising:

a non-inverting input terminal;

an inverting input terminal;

an output terminal;

a first output stage which outputs current to said output terminal via a current-mirror portion based on a voltage difference input to said non-inverting and inverting terminals; and a second output stage which comprises a plurality of output stages, each comprising a current providing portion connected with said current-mirror portion of said first output stage in a current-mirror manner for providing current, and outputting the current to said output terminal via a rectifying portion and a switch portion.

12. The transconductance amplifier as claimed in claim 10, wherein said current providing portion of said second output stage comprises a plurality of current providing portions, and an enabling portion which either enables or disables, individually, said plurality of current providing portions to provide current to said output terminal.

13. An automatic gain control device comprising:

a transconductance amplifier which provides an output current from an output terminal thereof based on a voltage difference input to a non-inverting input terminal and an inverting input terminal thereof;

a pre-processing portion which provides the voltage difference based on an amplitude of an output signal of an apparatus, a gain of which is controlled by said device, to said transconductance amplifier; and a post-processing portion which provides a gain control signal based on the output current of said transconductance amplifier to said apparatus, the gain of said apparatus being controlled by the gain control signal, wherein said transconductance amplifier comprises:
  a first output stage which outputs current to said output terminal via a current-mirror portion based on the voltage difference input to said non-inverting and inverting terminals; and
  a second output stage which comprises current providing means connected with said current-mirror portion of said first output stage in a current-mirror manner for providing current, and outputs the current to said output terminal via a rectifying portion and a switch portion.

14. An automatic gain control device comprising:

a transconductance amplifier which provides an output current from an output terminal thereof based on a voltage difference input to a non-inverting input terminal and an inverting input terminal thereof;

a pre-processing portion which provides the voltage difference based on an amplitude of an output signal of an apparatus, a gain of which is controlled by said device, to said transconductance amplifier; and a post-processing portion which provides a gain control signal based on the output current of said transconductance amplifier to said apparatus, the gain of said apparatus being controlled by the gain control signal, wherein said transconductance amplifier comprises:
  a first output stage which outputs current to said output terminal via a current-mirror portion based on the voltage difference input to said non-inverting and inverting terminals; and
  a second output stage which comprises a plurality of output stages, each comprising current providing portion connected with said current-mirror portion of said first output stage in a current-mirror manner for providing current, and outputting the current to said output terminal via a rectifying portion and a switch portion.

15. The automatic gain control device as claimed in claim 13, wherein said current providing portion of said second output stage comprises a plurality of current providing portions, and an enabling portion which either enables or disables, individually, said plurality of current providing portions to provide current to said output terminal.

\* \* \* \* \*